Figure 1:
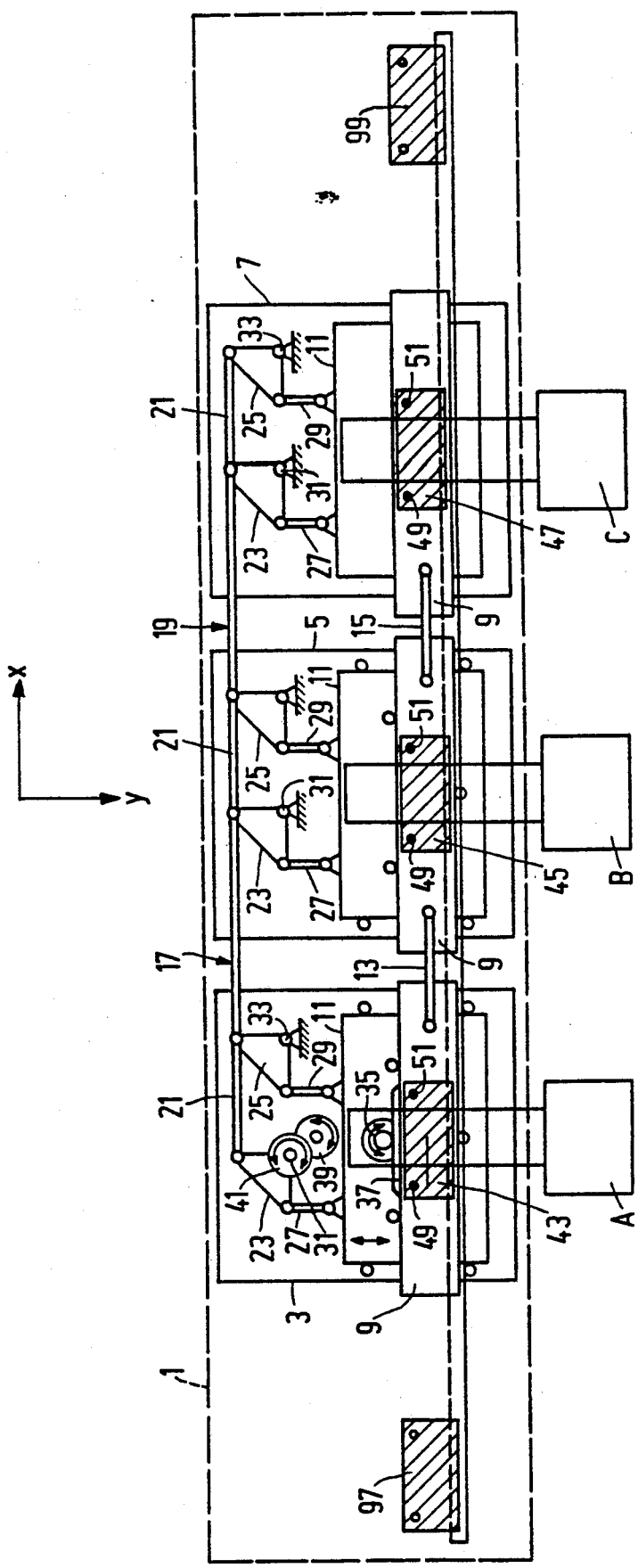

United States Patent [19]

Vermeer et al.

[11] Patent Number: 5,078,253
[45] Date of Patent: Jan. 7, 1992

[54] TRANSPORT DEVICE FOR CARRIERS

[75] Inventors: Adrianus J. P. M. Vermeer; Johannes T. A. van de Ven; Johannes J. H. Luijten, all of Eindhoven, Netherlands

[73] Assignee: U.S. Philips Corporation, New York, N.Y.

[21] Appl. No.: 325,027

[22] Filed: Mar. 16, 1989

Related U.S. Application Data

[63] Continuation of Ser. No. 123,401, Nov. 20, 1987, abandoned.

[30] Foreign Application Priority Data

Sep. 14, 1987 [NL] Netherlands ............... 8702181

[51] Int. Cl.⁵ .............................................. B65G 47/00
[52] U.S. Cl. ................................. 198/345.1; 29/741; 29/759
[58] Field of Search ............ 198/345, 468.6, 741, 198/692, 693, 345.1, 345.3; 414/222, 750; 29/741, 759

[56] References Cited

U.S. PATENT DOCUMENTS

| | | | |
|---|---|---|---|
| 2,851,145 | 9/1958 | Gagnon | 198/345 |
| 2,857,035 | 10/1958 | Gagnon | 198/692 |
| 4,202,092 | 5/1980 | Shibasaki et al. | 29/741 |
| 4,524,860 | 6/1985 | Misawa et al. | 198/692 |

Primary Examiner—Joseph E. Valenza

[57] ABSTRACT

A transport device for carriers (43,45,47) which can be coupled with a follower element (9) displaceable in two orthogonal transport directions (X,Y) by means of centering members (49,51) secured on the follower element, the carrier (43,45,47) is pivotable together with a guide (75,77) about an axis of rotation (71) parallel to one of the transport directions (X,Y) and is thus decoupled from and coupled with the centering members (49,51). The transport device may be used more particularly for plate-shaped carriers, but also for carriers provided with two parallel and straight guiding edges.

3 Claims, 6 Drawing Sheets

TRANSPORT DEVICE FOR CARRIERS

This is a continuation of application Ser. No. 123,401, filed Nov. 20, 1987 now abandoned.

The invention relates to a transport device for carriers comprising a follower element which is movable in a reciprocating manner in a first transport direction and can be coupled by means of centering members with a carrier, this follower element being displaceable in a second transport direction at right angles to the first transport direction, while the follower element is coupled with and decoupled from a carrier by a relative displacement of carrier and follower element in a direction at right angles to a plane passing through the first and second transport directions.

The transport device is more particularly intended for plate-shaped carriers, such as, for example, printed circuit boards. It should be noted that the term "plate-shaped carriers" used hereinafter also includes within the scope of the invention carriers of different shapes, such as, for example, a box or a frame of an apparatus having parallel and straight edges located in a plate compartment.

In a transport device mentioned in the opening paragraph and known from U.S. Pat. No. 4,202,092, a follower element provided with arms with centering pins is not only displaceable in a direction parallel to the first transport direction, but is also rotatable about an axis of rotation parallel to the first transport direction. A disadvantage of such a transport device is that the positioning accuracy of the centering pins is comparatively low because it is influenced to a considerable extent by inaccuracies in the guidance for the rotary movement of the follower element about the axis of rotation parallel to the first transport direction.

The invention has for its object to provide a transport device having a comparatively high positioning accuracy of the centering members for the plate-shaped carriers.

The transport device according to the invention is for this purpose characterized in that the transport device is provided with a guide for the carrier, which is pivotable about an axis of rotation parallel to the first transport direction, extends in the first transport direction and is displaceable, when pivoted about the said axis of rotation, together with the carrier in a direction at right angles to the plane through the first and second transport directions.

The invention is based on the recognition of the fact that the plate-shaped carriers can be centered by means of centering members very accurately if the construction for the guidance or displacement of the follower element in the first transport direction is decoupled from the construction of another movement mechanism, more particularly the movement mechanism by which the relative movement of carrier and centering members is obtained.

It should be noted that U.S. Pat. No. 4,524,860 discloses a transport device comprising an arm mechanism for coupling and decoupling a plate-shaped carrier with and from centering members, this carrier being displaced parallel to the first transport direction by means of a separate transporter. Although in this case a decoupling of the translatory movement of the transporter and the centering and decentering movement, respectively, of the arm mechanism is concerned, the possibility of translation of the arm mechanism parallel to the first transport direction nevertheless again leads to a comparatively low positioning accuracy.

Further, a transport device of the indexing type is known from U.S. Pat. No. 2,851,145, in which at discrete areas along an assembly line transmission mechanisms are arranged. The construction of these transmission mechanisms is not coupled with the construction for the translatory movement of the plate-shaped carriers. On the contrary, the centering members can be coupled and decoupled only at the area of the transmission mechanisms so that there is a considerable limitation with respect to the choice of the place of the working stations, the choice of the kind and the size of the product, etc. A so-called freely programmable assembly line, which can be readily adapted in the case of product modification, cannot be obtained with the transport devices of the indexing type.

A particular embodiment of the transport device according to the invention, which permits a comparatively large variation of the length of the plate-shaped carriers viewed in the first transport direction, is further characterized in that a carrier is guided with a first edge in a first guide pivotable about the axis of rotation and is guided with a second edge parallel to the first edge in a second guide, which is pivotable together with the first guide about the axis of rotation and is parallel to the first guide.

A further embodiment of the transport device with a large freedom of choice with respect to the centering holes in the plate-shaped carrier, is characterized in that the follower element is provided with a row of detachably secured centering pins arranged regularly in the first transport direction.

A further embodiment of the transport device which facilitates the adaptation of the production capacity due to its modular construction is characterized in that the transport device comprises at least two positioning modules, one positioning module having an X carriage displaceable parallel to the first transport direction, which is displaceable together with a Y carriage in a direction parallel to the second transport direction at right angles to the first transport direction, while the X carriages and Y carriages of different positioning modules are connected to each other by a first coupling and a second coupling, respectively.

Figure 2:
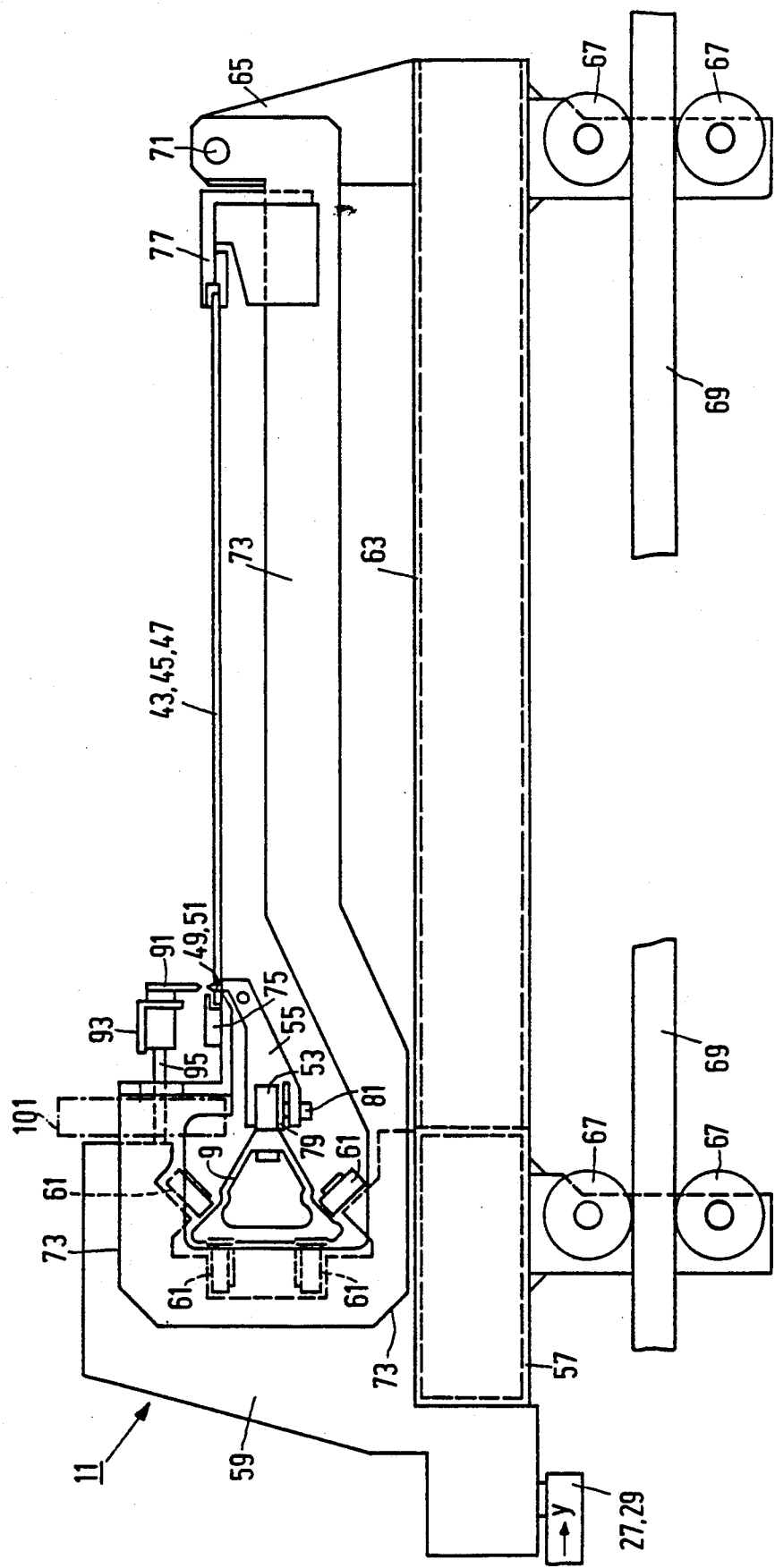
Figure 3:
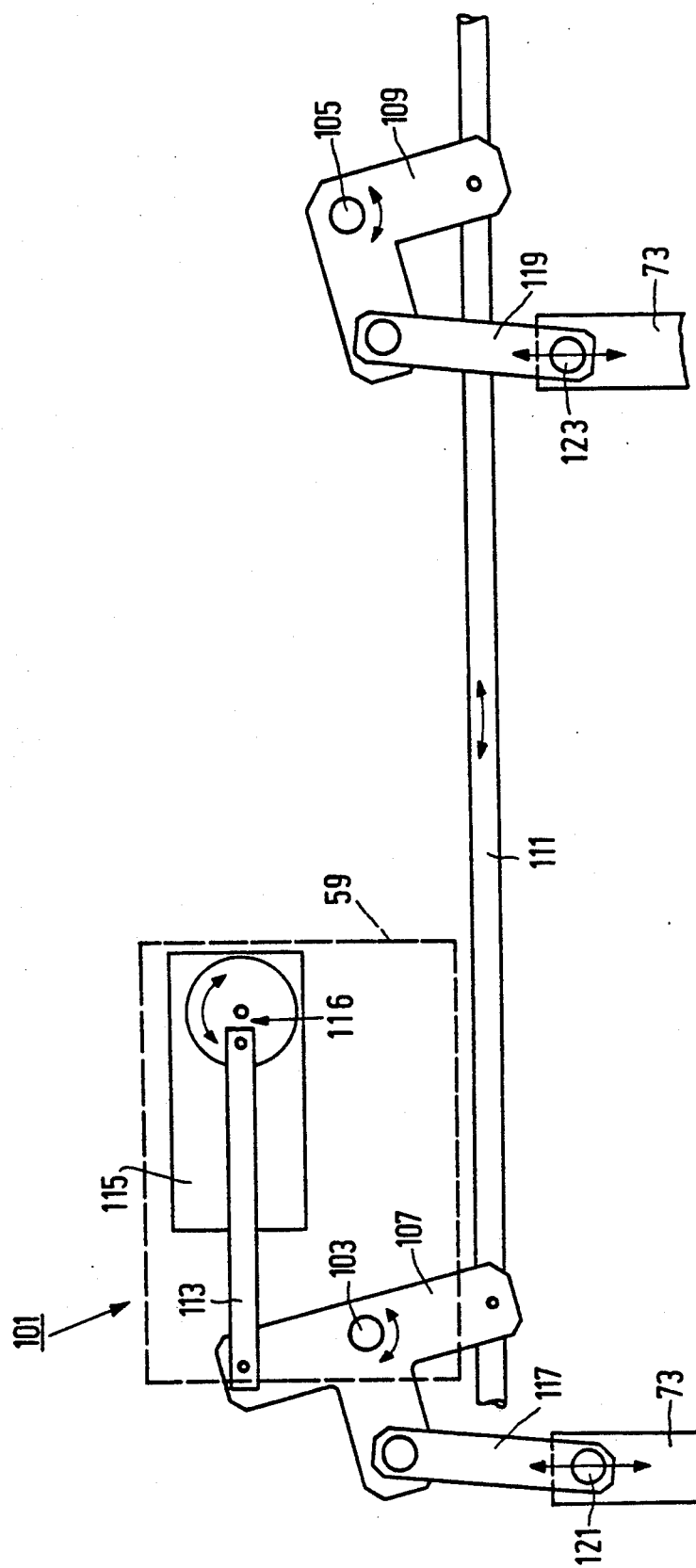
Figure 4:
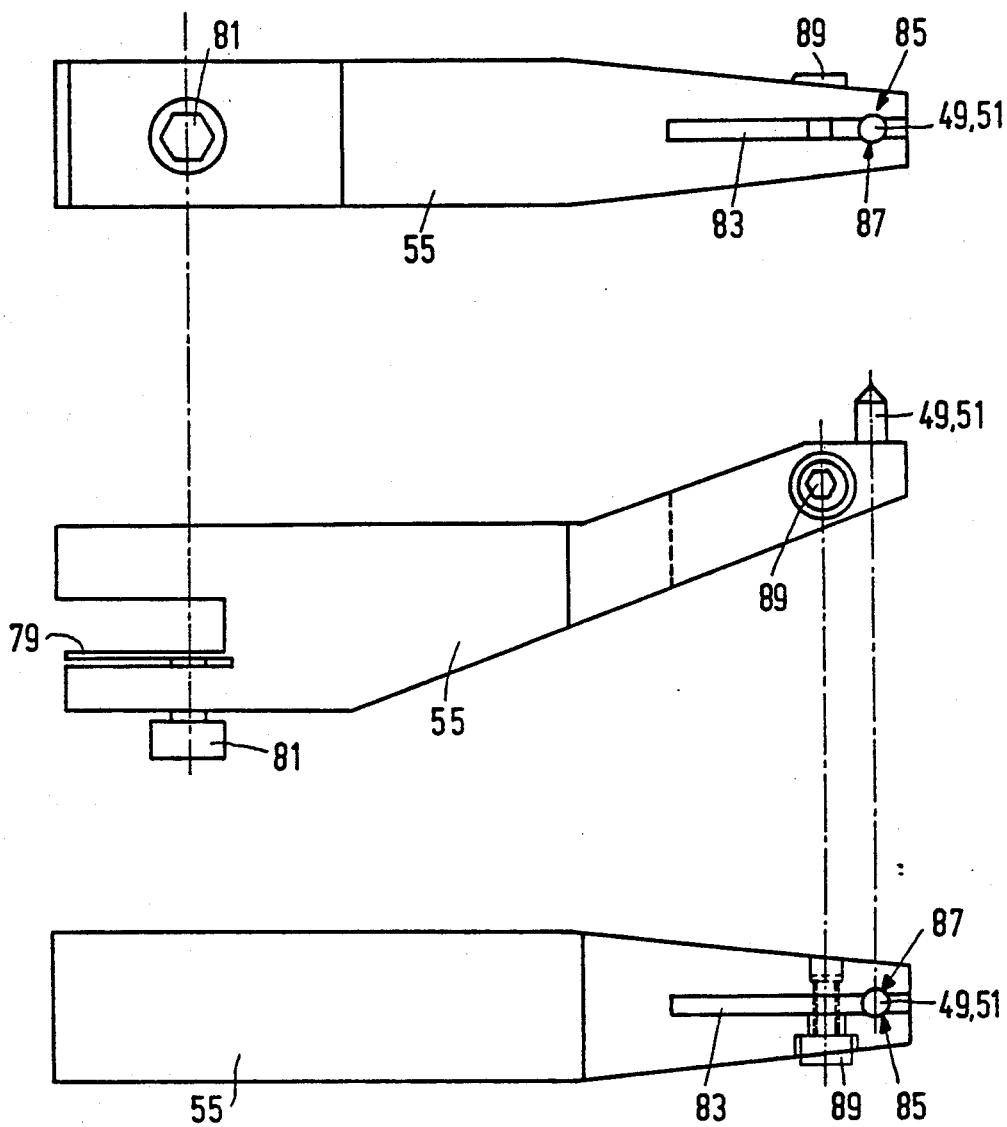
Figure 5:
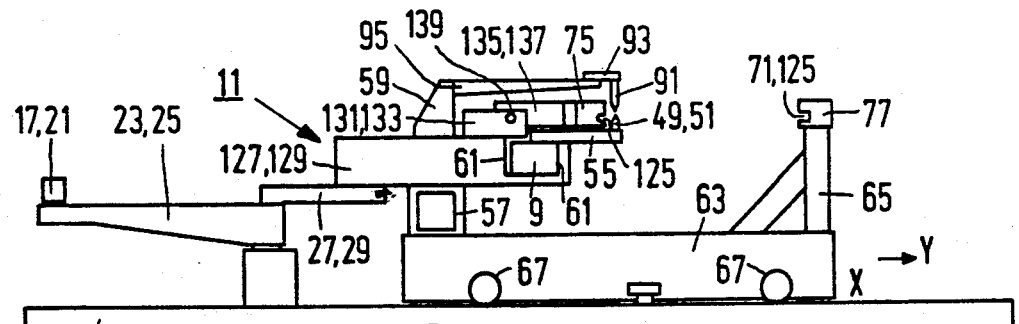
Figure 6:
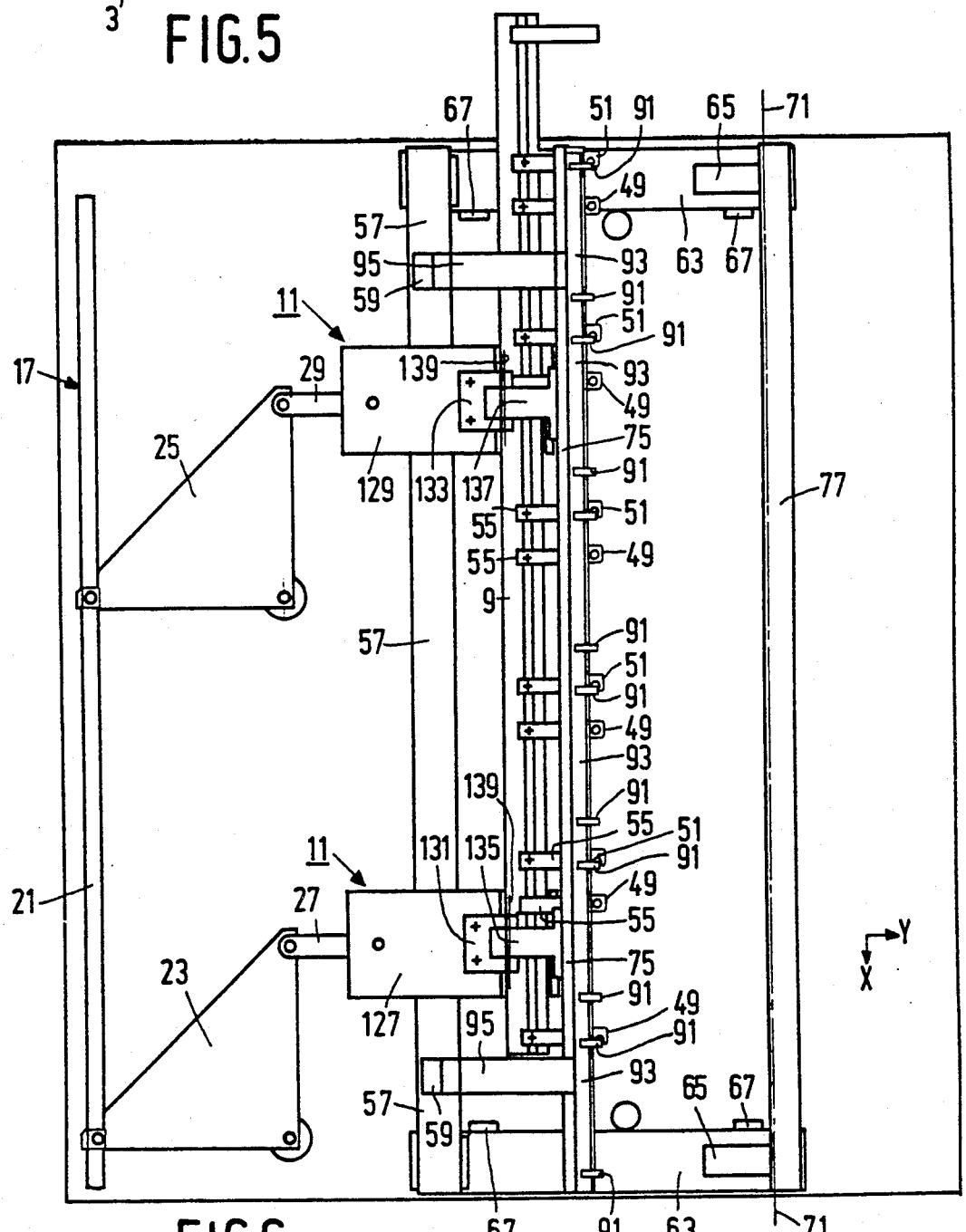
Figure 7:
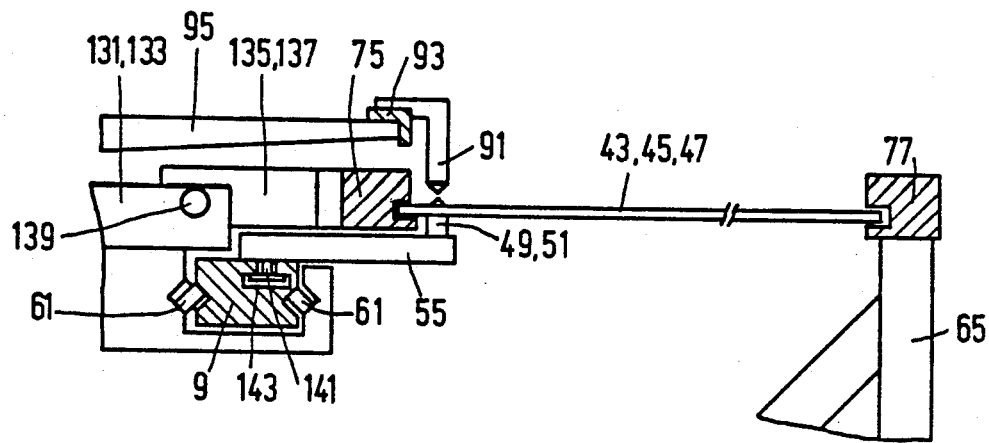
Figure 8:
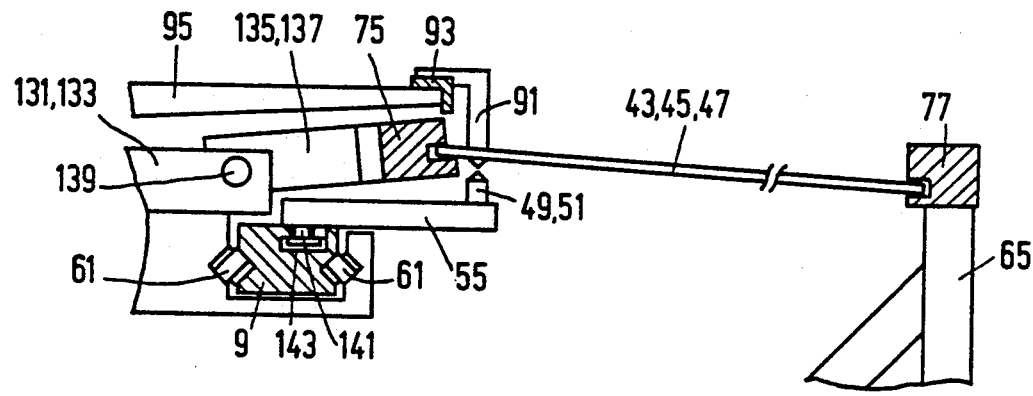

The invention will be described more fully with reference to the drawing, in which:

FIG. 1 shows diagrammatically in plan view an assembly line with a transport device according to the invention, FIG. 2 shows in side elevation a part of a first embodiment of the transport device, FIG. 3 is a front elevation of a lifting mechanism used in the transport device shown in FIG. 2, FIG. 4 shows a plan view, a side elevation and a bottom view of a centering member used in the transport device shown in FIG. 2, FIG. 5 is a side elevation of a part of a second embodiment of the transport device, FIG. 6 is a plan view of the transport device shown in FIG. 5, FIG. 7 is a sectional view of the transport device shown in FIG. 5 having a plate-shaped carrier in the centered position, FIG. 8 shows in sectional view the transport device shown in FIG. 5 having a plate-shaped carrier in the pivoted position.

The assembly line shown in FIG. 1 is intended for mounting component parts on plate-shaped carriers, such as, for example, for arranging electronic components on a printed circuit board. In the assembly line shown, there are three working stations A, B and C beside a transport device 1. In a manner known, simple or multiple placement automatons are arranged in the working stations A, B and C. The transport device 1 comprises three positioning modules 3, 5 and 7, which are arranged in a row extending in the X direction and the module 3 of which serves at the same time as driving module. Each positioning module is provided with an X carriage 9 displaceable parallel to the X direction and a Y carriage 11 displaceable parallel to the Y direction. The X carriages 9 supported by the Y carriages 11 can be displaced parallel both to the X and to the Y direction. In the latter case, the Y carriages also move parallel to the Y direction. The X carriages 9 of the positioning modules 3 and 5 are coupled with each other by a rod 13, while the X carriages 9 of the positioning modules 5 and 7 are coupled with each other by a rod 15. The rods 13 and 15 constitute the first coupling already mentioned. The Y carriages 11 of the positioning modules 3, 5 and the positioning modules 5, 7 are also connected to each other by rods 17 and 19, respectively (second coupling). The rods 17 and 19 have a portion 21, which is pivotably secured to triangular links 23 and 25, which are pivotably secured by means of rods 27 and 29 to the Y carriages 11. The links 23 and 25 are rotatable in fixedly arranged pivots 31 and 33. Both the X and the Y carriages are displaceable by means of rollers along straight guides, as will be explained with reference to FIG. 2. The drive in the X direction takes place by means of a pinion 35, which is driven by an electric motor (not visible) and is in engagement with a toothed rim 37. The pinion 35 is situated on the outgoing shaft of an electric motor secured on the Y carriage 11 of the driving module 3 and the toothed rim 37 is secured on the X carriage 9 of the same module. The drive in the Y direction is obtained by means of a pinion 39, which is driven by a fixedly arranged electric motor (not shown) and is in engagement with a gear wheel 41, of which the axis of rotation coincides with the pivot shaft of the link 23. The X carriages 9 of the positioning modules 3, 5 and 7 are provided with a number of printed circuit boards. FIG. 1 shows only three printed circuit boards 43, 45 and 47, which are being machined in the working stations A, B and C, respectively. The distance over which a printed circuit board is transported per displacement cycle by an X carriage 9 in the X direction is equal to the length of a printed circuit board plus the relative distance of two successive printed circuit boards, both in the same positioning module and in successive positioning modules. This so-called pitch distance between printed circuit boards is therefore constant. This means in other words that the distance in the X direction between two successive printed circuit boards in the same positioning module is equal to the distance between the last printed circuit board in one positioning module and the first printed circuit board in the succeeding positioning module. The distance between different modules may also be so large that the pitch distance between the printed circuit boards no longer corresponds to the overall periodical displacement the X carriages have to perform to transport a printed circuit board from one module to the other. In this case, a number of printed circuit boards are permanently situated between the positioning modules.

On an X carriage 9 the position of a printed circuit board is determined by two centering members in the form of centering pins 49 and 51, which are detachably secured to the X carriage. As appears from FIG. 2—in which a first embodiment of the transport device is shown—, an X carriage 9 is constituted by a profile which is triangular in a sectional view transverse to the X direction and to which an elongate lath 53 is secured, which is provided with two pin holders 55. A centering pin is mounted in each of the pin holders 55. The Y carriage 11 comprises a cylinder 57, which extends parallel to the X direction and is provided with two blocks 59 (of which only one block is shown in FIG. 2). In each of the two blocks 59 are rotatably arranged four running rollers 61, along which the X carriage 9 is guided. To the cylinder 57 are secured two arms 63 (only one of which is shown in FIG. 2) which are at right angles to the X direction and which are each provided with a support 65. The Y carriage 11 is guided parallel to the Y direction by means of four pairs of running rollers 67 along two guides 69. An arm 73 rotatable about an axis of rotation 71 is journalled in each of the supports 65. On the arms 73 are secured two guides 75 and 77 extending parallel to the X direction.

The guides 75 and 77 are pivotable about the axis of rotation 71 of the arms 73. The mechanism for rotation of the arms 73 and hence the pivoting of the guides 75 and 77 about the axis of rotation 71 will be described more fully hereinafter with reference to FIG. 3. The pin holder 55 is provided with a flexible tongue 79, which is pressed by means of a screw 81 against the lath 53 so that a clamping connection is formed between the arm and the lath. The centering pins 49,51 are also secured to the arm by means of a clamping connection. For this purpose, the pin holder 55 is provided with a slot 83 and with two oppositely arranged cylindrical engagement surfaces 85 and 87, which form a bearing for the centering pins. The centering pins 49 and 51 are clamped by means of a screw 89 in a manner that is known. Opposite to the centering pins 49,51 mounted on the pin holders 55 are arranged locking pins 91, which are secured to an elongate support 93. The support 93 is connected by rods 95 to the blocks 59. Preferably, a lath 53 and a support 93 individual for each positioning module are used. This also applies to the guides 75 and 77. However, it is possible to utilize a lath 53, a support 93 and guides 75 and 77 common to all the positioning modules. In the embodiment shown in FIG. 2, alternatively an X carriage common to all the positioning modules may be used. The couplings 13 in the form of rods are then replaced by the aforementioned profile of triangular cross-section, which extends throughout the length of the assembly line.

After termination of the operations on the printed circuit boards 43, 45 and 47 in the working stations A, B and C, a displacement parallel to the X direction of all the printed circuit boards disposed on the assembly line has to take place over the aforementioned pitch distance. Furthermore, at the beginning of the assembly line 1 (cf. FIG. 1) a printed circuit board 97 being in a waiting position has to be transported to the first positioning module 3, while at the end of the assembly line a printed circuit board 99 after transport over the pitch distance has to be transferred to a supply of finished products. This is possible, for example, by lengthening the lath 53 with pin holders 55 beyond the first and the last positioning modules and by using the displacement over the pitch distance for supplying and discharging printed circuit boards to and from the said modules. Subsequently, by X-Y displacements within a positioning module essentially any part of the printed circuit board can be carried under, for example, a component placement mechanism of the working station. Before a new printed circuit board is transported to a working station, the combination of X carriages 9, lath 53 and pin holder 55 acting as a follower element and coupled with the printed circuit boards must be decoupled and must be displaced over a pitch distance in the negative X direction. For this purpose, the guides 75 and 77 secured to the arm 73 are pivoted about the axis of rotation 71 by means of a lifting mechanism 101 indicated by dotted lines in FIG. 2 and shown in detail in FIG. 3. Pivot shafts 103 and 105 are rotatably secured in the two blocks 59 of FIG. 2. The pivot shafts 103 and 105 have connected to them links 107 and 109, which are coupled by a rod 111. The rod 111 extending parallel to the X direction may be common to the lifting mechanisms 101 of all the positioning modules. Preferably, however, use is made of an individual rod 111 for each positioning module. When the rods 111 of the various modules are coupled to each other, one lifting mechanism 101 for all rods is sufficient. To the link 107 is pivotably secured a rod 113, which is displaceable by means of a so-called pneumatic rotation cylinder 115 (shown diagrammatically) of a conventional type having a crank 116. The links 107 and 109 are hinged to the arms 73 by means of rods 117 and 119 with spherical pivots 121 and 123. FIG. 3 indicates diagrammatically in dotted lines that the rotation cylinder 115 is secured in a block 59. When the guides 75 and 77 are pivoted about the axis of rotation 71, all the printed circuit boards in the guides are pivoted about the axis of rotation 71 so that the printed circuit boards are decoupled from the centering pins 49,51. The pivot angle is such that the printed circuit boards are then centered again by the locking pins 91, which are fixedly arranged with respect to the Y carriages 11. By means of the now decoupled combination of X carriages 9, lath 53 and pin holder 55, as already stated, a displacement is carried out in the negative X direction over the pitch distance.

During this displacement, the locking pins 91 prevent the printed circuit boards from being displaced parallel to the X direction in the guides 75 and 77, for example due to vibrations. After the displacement over the pitch distance in the negative X direction has been accomplished, the arms 73 are turned back, as a result of which the printed circuit boards are detached from the locking pins 91 and are centered again on the centering pins 49,51. Subsequently, the combination of X carriages 9, lath 53 and pin holder 55 acting as a follower element is displaced over the pitch distance in the positive X direction so that a new printed circuit board is supplied to each working station and at the same time a fully machined printed circuit board is added to the supply of finished products.

The second embodiment of the transport device according to the invention shown in FIGS. 5, 6, 7 and 8 is provided as far as possible with reference numerals according to FIGS. 1 to 4. Corresponding reference numerals are also used for non-identical parts fulfilling a comparable function.

The most important difference between the two embodiments resides in the positioning and the nature of the axis of rotation 71. The guides 75 and 77 provided with a slot 125 of U-shaped cross-section for the printed circuit boards are now no longer pivoted together about the axis of rotation 71 because of the guide 77 being fixedly connected to the Y carriage 11. The size of the slots 125 in the guides 75 and 77 is chosen so that the printed circuit boards can pivot through a sufficiently large angle for detachment of the centering pins 49,51 and the coupling with the locking pins 91. In fact, the slot 125 in the guide 77 consequently serves as the axis of rotation 71. According as the printed circuit boards, viewed in the X direction, become longer, either the clearance of the slot 125 around the edge of a printed circuit board or the straightness of the said edge must increase. For an important category of printed circuit boards of product carriers, the tolerances of board, edge and slot do not give rise to problems, however.

As appears from FIGS. 5 and 6, yokes 127 and 129 are secured to the rods 27 and 29, these yokes being provided with forks 131 and 133, in which links 135 and 137 are rotatably journalled. The links 135 and 137, which are secured to the guide 75, are rotatable about an axis of rotation 139 by means of a lifting mechanism 101 of the kind described with reference to FIG. 3. The rods 117 and 119 are then connected by means of spherical pivots to the guide 75. The blocks 59 have secured to them the rods 95, which carry the support 93 of the locking pins 91 extending along all the positioning modules.

Since it must be possible for the pin holders 55 to be arranged in an arbitrary position in the X direction, they are mounted on the X carriages 9 by means of T-shaped couplings 141, which are slipped into the T-shaped slot 143. A clamping connection between the pin holders 55 and the X carriages can be obtained in that the T-shaped couplings 141 are tightened from above by screws. When the pin holders 55 are displaced in the X direction, an adaptation is obtained for different pitch distances of the centering holes in printed circuit boards or more generally product carriers.

It should be noted that a fully modular construction is obtained if the X carriages 9 have such a length that they extend only over a single positioning module, as indicated in FIG. 1. In the embodiments described with reference to the remaining Figures, the X carriages 9 extended over all the modules and also between the modules so that the said first couplings were dispensed with. However, it is clear that the freedom of choice between transport device with or without first couplings is important because in the case of increase of capacity or decrease of capacity a correct adaptation can be obtained by the addition of couplings in modules and the removal of couplings from modules or shortening of X carriages, respectively. In fact, a freely programmable flexible transport device is obtained, which can be very readily modified in the case of product changes. The supply and discharge of product carriers need not necessarily take place at the beginning and at the end of the assembly line. It is possible, for example, to use local supply and discharge at the working stations. This strongly depends upon the whole production system in which the transport device must be integrated.

What is claimed is:

1. A transport device comprising a plurality of carriers, a follower element which is movable in a reciprocating manner in a first transport direction, centering members coupling said follower element to at least one of said carriers, said follower element being displaceable in a second transport direction at right angles to said first transport direction, said follower element and said at least one said carrier cooperating with each other and being coupled and uncoupled from each other by displacement of said at least one said carrier and said follower element in a direction at right angles to a plane passing through said first and second transport directions, and at least one guide for said at least one said carrier, said at least one guide being pivotable about an axis of rotation parallel to said first transport direction, said at least one guide extending in said first transport direction, said at least one guide and said at least one said carrier being connectable to each other and when so connected both being pivotable about said axis of rotation which causes displacement of both in a direction at right angles to the plane through said first and second transport directions.

2. A transport device as claimed in claim 1, wherein said at least one guide includes a first guide pivotable about said axis of rotation and a second guide which is also pivotable together with said first guide about said axis of rotation, said second guide being parallel to said first guide, said at least one said carrier having a first edge guided in said first guide and a second edge guided in said second guide.

3. A transport device as claimed in claim 1 or claim 2, wherein said centering members include a row of detachably secured centering pins arranged regularly in said first transport direction.

* * * * *